(12) United States Patent
Xiao et al.

(10) Patent No.: US 10,274,633 B2
(45) Date of Patent: Apr. 30, 2019

(54) THREE DIMENSIONAL NUCLEAR MAGNETIC RESONANCE LOGGING INSTRUMENT BASED ON MULTIPLE ANTENNA EXCITATION

(71) Applicant: CHINA UNIVERSITY OF PETROLEUM-BEIJING, Beijing (CN)

(72) Inventors: Lizhi Xiao, Beijing (CN); Wei Liu, Beijing (CN); Guangzhi Liao, Beijing (CN); Xin Li, Beijing (CN)

(73) Assignee: CHINA UNIVERSITY OF PETROLEUM-BEIJING, Beijing (CN)

( * ) Notice: Subject to any disclaimer, the term of this patent is extended or adjusted under 35 U.S.C. 154(b) by 328 days.

(21) Appl. No.: 15/258,703

(22) Filed: Sep. 7, 2016

(65) Prior Publication Data

US 2017/0082771 A1    Mar. 23, 2017

(30) Foreign Application Priority Data

Sep. 23, 2015 (CN) .......................... 2015 1 0614285

(51) Int. Cl.
*G01V 3/32* (2006.01)
*G01R 33/34* (2006.01)
(Continued)

(52) U.S. Cl.
CPC ......... *G01V 3/32* (2013.01); *G01R 33/34007* (2013.01); *E21B 47/00* (2013.01);
(Continued)

(58) Field of Classification Search
None
See application file for complete search history.

(56) References Cited

U.S. PATENT DOCUMENTS

2008/0174309 A1    7/2008    Pusiol et al. .................. 324/306

FOREIGN PATENT DOCUMENTS

CN    101098047 A    1/2008
CN    102519999 A    6/2012
(Continued)

OTHER PUBLICATIONS

English translation of CN-103233724-A using Google Patent (Year: 2013).*
(Continued)

*Primary Examiner* — Paresh H Patel
(74) *Attorney, Agent, or Firm* — J.C. Patents

(57) ABSTRACT

The present invention provides a three dimensional nuclear magnetic resonance logging instrument based on multiple antenna excitation, including: a probe, an excitation transmitter and a bearing component; the probe includes magnet and multiple antennas arranged at outer side of the magnet, and the multiple antenna individually and independently provide feed; a holding cavity is provided in the bearing component, and the excitation transmitter is fixed in the holding cavity; and the excitation transmitter includes a transmitter framework and an excitation circuit; the transmitter framework and the bearing component are fixedly connected; and the excitation circuit is fixed on the transmitter framework, and is electrically connected with each of the multiple antennas for feeding the multiple antennas.

10 Claims, 2 Drawing Sheets

(51) Int. Cl.
  *G01R 33/36* (2006.01)
  *G01R 33/38* (2006.01)
  *G01R 33/3415* (2006.01)
  *E21B 47/00* (2012.01)

(52) U.S. Cl.
  CPC ...... *G01R 33/3415* (2013.01); *G01R 33/3614* (2013.01); *G01R 33/3808* (2013.01)

(56) References Cited

FOREIGN PATENT DOCUMENTS

| | | |
|---|---|---|
| CN | 103233724 A | 8/2013 |
| CN | 203594440 U | 5/2014 |
| CN | 203867568 U | 10/2014 |
| FR | 1251217 A * 1/1961 | ............. G11C 8/005 |

OTHER PUBLICATIONS

The Chinese First Examination Report of corresponding China patent application No. 201510614285.2, dated Aug. 17, 2017.

* cited by examiner

US 10,274,633 B2

THREE DIMENSIONAL NUCLEAR MAGNETIC RESONANCE LOGGING INSTRUMENT BASED ON MULTIPLE ANTENNA EXCITATION

CROSS-REFERENCE TO RELATED APPLICATIONS

This application claims priority to Chinese Patent Application No. 201510614285.2, filed on Sep. 23, 2015, the content of which is hereby incorporated by reference in its entirety.

TECHNICAL FIELD

The invention relates to the field of nuclear magnetic resonance logging technology, and in particular to a nuclear magnetic resonance logging instrument.

BACKGROUND

Immediately following its discovery in 1946, nuclear magnetic resonance (Nuclear Magnetic Resonance, NMR) phenomenon found application in fields such as physics, chemistry, material science, life science and medicine. And the application of nuclear magnetic resonance in petroleum and natural gas industry, pioneered by utilization in the field of reservoir petrophysics, was initiated in the 1950s. A nuclear magnetic resonance logging instrument can perform stratum information detection around a wellbore by employing the principle of nuclear magnetic resonance, and is thus provided with unique capacity for qualitative identification and quantitative evaluation of reservoir fluid.

Probe is one of the important parts of a nuclear magnetic resonance logging instrument, and its structure determines key performances, such as measurement mode, nuclear magnetic resonance region and nuclear magnetic resonance signal intensity of the instrument. A nuclear magnetic resonance logging instrument probe mainly includes a magnet and an antenna, where the magnet can form a static magnetic field for polarizing a self-spinning hydrogen proton, while the antenna can transmit a radio frequency field for turning the self-spinning hydrogen proton around. And removing the radio frequency field prompts the self-spinning hydrogen proton to precess along the static magnetic field, resulting in nuclear magnetic resonance induction signals, detection of which makes it possible to analyze the formation condition.

In the prior art, a nuclear magnetic resonance logging instrument probe usually adopts a cylindrical magnet, in which the circular faces at two sides of the magnet serve as an N pole and an S pole, respectively, and closed magnetic induction lines directed from the N pole to the S pole form magnetic field distribution; an antenna encircles the magnet, allowing excitation of a polarized formation region around the wellbore in 360 degrees, thus making the region around the wellbore free of detection blind area, and enabling multi-frequency multi-section measurement, but the measured signal can only be an average signal of the signals in 360 degrees stratum. Therefore, the nuclear magnetic resonance logging instrument probe in the prior art can only conduct signal detection in a radial depth dimension and an axial depth dimension, and is incapable of carrying out signal detection of multidirectional sensitive region in the circumferential direction.

SUMMARY

The present invention provides a nuclear magnetic resonance logging instrument, for addressing the technical problem that in the prior art, the nuclear magnetic resonance logging instrument can only conduct signal detection in a radial depth dimension and an axial depth dimension, and is incapable of carrying out signal detection of multidirectional sensitive regions in the circumferential direction.

The present invention provides a nuclear magnetic resonance logging instrument, including: a probe, an excitation transmitter and a bearing component;

The probe includes: a magnet and multiple antennas arranged at outer side of the magnet, and the multiple antennas individually and independently provide feed;

A holding cavity is provided in the bearing component, and the excitation transmitter is fixed in the holding cavity; and The excitation transmitter includes a transmitter framework and an excitation circuit; the transmitter framework and the bearing component are fixedly connected; and the excitation circuit is fixed on the transmitter framework, and is electrically connected with each of the multiple antennas for feeding the multiple antennas.

Further, the transmitter framework includes two end portions and a middle part arranged between the two end portions, the middle part is of prismatic shape, and the end portions are of cylindrical shape;

The middle part and the two end portions are of an integrated structure;

The excitation circuit is fixedly arranged on a side face of the middle part.

Further, the excitation circuit is divided into multiple circuit boards, the number of the circuit boards is less than or equal to the number of lateral edges of the middle part; and The multiple circuit boards are respectively fixed on different side faces of the middle part.

Further, a shielding groove is formed on each side face of the middle part and is shaped to match with a shape of the circuit board; and The multiple circuit boards are respectively arranged in multiple shielding grooves to be fixed to the middle part through a screw.

Further, a length of the transmitter framework is matched with a length of the holding cavity of the bearing component, and a sealing ring is provided between the end portions of the transmitter framework and the bearing component.

Further, the holding cavity is cylindrical, and the end portions and the bearing component form interference fit; or The end portions are provided with multiple bulges, multiple recesses are provided in the bearing component to match with the multiple bulges, and the multiple bulges are respectively fastened by the multiple recesses.

Further, the excitation circuit includes: a bus interface circuit, a transmission controller, a level conversion circuit, a power tube driving circuit, a power amplifying circuit and a coupling transformer;

The bus interface circuit is configured to receive a signal transmission command sent by a control center, and to convert the signal transmission command into an instruction that is processable to the transmission controller;

The transmission controller is electrically connected with the bus interface circuit, and is configured to receive the instruction sent by the bus interface circuit and generate a pulse signal according to the instruction;

The level conversion circuit is electrically connected with the transmission controller, and is configured to convert the pulse signal generated by the transmission controller into a pulse signal suitable for processing by the power tube driving circuit;

The power tube driving circuit is electrically connected with the level conversion circuit, and is configured to generate a driving signal to drive the power amplifying circuit, according to the pulse signal outputted by the level conversion circuit;

The power amplifying circuit is electrically connected with the power tube driving circuit, and is configured for power amplification of the driving signal so as to generate a power amplified signal; and The coupling transformer is electrically connected with the power amplifying circuit, and is configured to generate an excitation signal according to the power amplified signal, and the excitation signal is configured to excite the antennas of the probe.

Further, the probe also includes: a housing; and the antennas are arranged in the housing;

A through hole is correspondingly formed on the bearing component and the housing for a sealing joint to pass through; and The excitation circuit and the antenna are electrically connected via a wire, and the wire passes through the sealing joint.

Further, the nuclear magnetic resonance logging instrument is a while drilling nuclear magnetic resonance logging instrument; and Correspondingly, the bearing component is a drill collar; and a slurry channel is formed in both the drill collar and the transmitter framework for drilling fluid to flow through.

Further, the nuclear magnetic resonance logging instrument is a wire-line nuclear magnetic resonance logging instrument; and Correspondingly, the bearing component is a short instrument section.

According to the nuclear magnetic resonance logging instrument provided by the present invention, multiple antennas, which individually and independently provide feed, are distributed around a magnet; and through exciting different antennas, it is possible to realize detection of stratum information at different azimuth angles, thus improving circumferential resolution of a nuclear magnetic resonance logging instrument probe, and realizing formation detection in three dimensions in the direction of the radius, axis and circumference.

1-a bearing component; 2-a slurry channel; 3-a magnet; 4-a housing; 5-a middle part; 6-an end portion; 7-a circuit board; 8-a sealing ring; 9-a bus interface circuit; 10-a transmission controller; 11-a level conversion circuit; 12-a power tube driving circuit; 13-a power amplifying circuit; 14-a coupling transformer; 15-a first sealing joint; 16-a second sealing joint; 17-a relay; 18-a cover; 19-an antenna

DESCRIPTION OF EMBODIMENTS

In order to make a clearer description of the purpose, technical solutions and advantages of embodiments of the present invention, the technical solutions in the embodiments of the present invention will be clearly and completely described in conjunction with accompanying figures in the embodiments of the present invention hereafter, and apparently, the described embodiments are just part rather than all of the embodiments of the present invention. All the other embodiments obtained based on the embodiments in the present invention by one of ordinary skill in the art without creative effort shall fall into the protection scope of the present invention.

Embodiment 1

Figure 1:
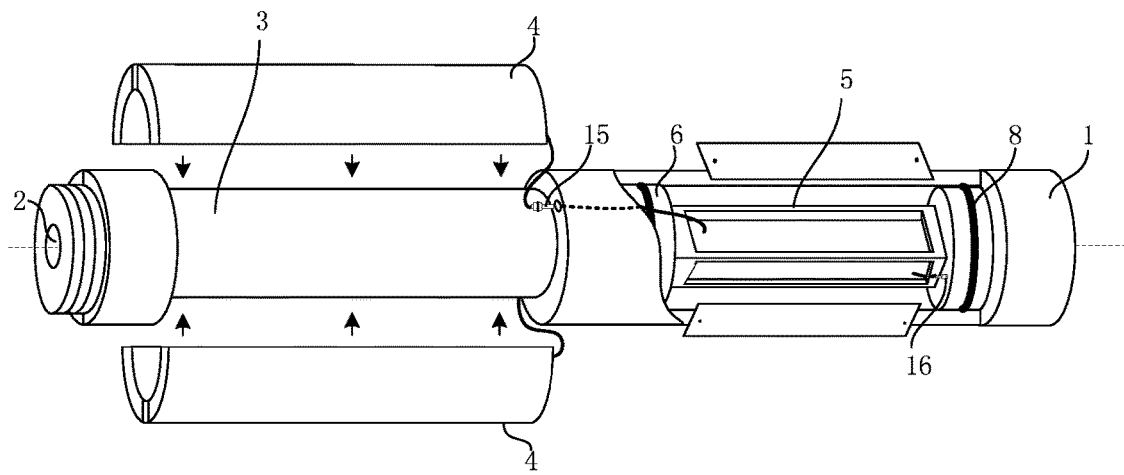
FIG. 1 is a structure diagram of a nuclear magnetic resonance logging instrument provided by Embodiment 1 of the present invention.

Embodiment 1 of the present invention provides a nuclear magnetic resonance logging instrument. FIG. 1 is a structure diagram of a nuclear magnetic resonance logging instrument provided by Embodiment 1 of the present invention. As shown in FIG. 1, the nuclear magnetic resonance logging instrument in this embodiment may include: a probe, an excitation transmitter and a bearing component 1;

The probe includes: a magnet 3 and multiple antennas 19 arranged at outer side of the magnet 3, and the multiple antenna 19 individually and independently provide feed;

A holding cavity is provided in the bearing component 1, and the excitation transmitter is fixed in the holding cavity;

The excitation transmitter includes a transmitter framework and an excitation circuit; the transmitter framework and the bearing component are fixedly connected; and the excitation circuit is fixed on the transmitter framework, and is electrically connected with each of the multiple antennas 19 for feeding the multiple antennas 19.

Specifically, the nuclear magnetic resonance logging instrument provided by this embodiment may be a while drilling nuclear magnetic resonance logging instrument, the bearing component 1 may be a drill collar, and a slurry channel 2 is formed in both the bearing component 1 and the transmitter framework for drilling fluid to flow through. A central axis of the slurry channel 2 formed in the bearing component 1 could coincide with that of the slurry channel 2 formed in the transmitter framework, for facilitating the drilling fluid to flow through.

The nuclear magnetic resonance logging instrument in this embodiment mainly includes a probe and an excitation transmitter. The probe includes a magnet 3 and the antenna 19, and the magnet 3 may be of a cylindrical, rectangular, annulus or irregular shape. There may be multiple antennas 19, which arranged at outer side of the magnet 3 and distributed along a direction of circumference of the magnet 3, the antennas 19 may be of a strip or saddle shape. The multiple antennas 19 individually and independently provide feed, i.e., whether a certain antenna 19 is in the excited state or not has nothing to do with the excited state of other antennas 19.

In practical operation, a static magnetic field generated by the magnet 3 and a radiofrequency magnetic field generated by the antennas 19 jointly act upon stratum around a borehole, so as to realize detection of stratum information. Regarding the probe provided by this embodiment, thanks to the multiple antennas 19 distributed around the magnet 3, not only stratum information at one single azimuth angle can be detected by exciting one of the antennas 19, but stratum information at multiple azimuth angles can also be detected by exciting the multiple antennas 19. Assuming that four antennas 19 are evenly distributed at outer side of the magnet 3, and are respectively marked as antenna E (on the east), antenna W (on the west), antenna S (on the south) and antenna N (on the north), according to orientation thereof, then detection results obtained by exciting different antennas are shown in Table 1.

TABLE 1

| Mode | E | W | S | N | Results |
|---|---|---|---|---|---|
| 1 | + | − | − | − | stratum information on the east can be detected |
| 2 | − | + | − | − | stratum information on the west can be detected |
| 3 | − | − | + | − | stratum information on the south can be detected |
| 4 | − | − | − | + | stratum information on the north can be detected |
| 5 | + | + | − | − | stratum information on the east and the west can be detected |
| 6 | + | − | + | − | stratum information on the east and the south can be detected |
| 7 | + | − | − | + | stratum information on the east and the north can be detected |
| 8 | − | + | + | − | stratum information on the west and the north can be detected |
| 9 | − | + | − | + | stratum information on the west and the south can be detected |
| 10 | − | − | + | + | stratum information on the south and the north can be detected |
| 11 | + | + | + | − | stratum information on the east, the west and the south can be detected |
| 12 | + | + | − | + | stratum information on the east, the west and the north can be detected |
| 13 | + | − | + | + | stratum information on the east, the south and the north can be detected |
| 14 | − | + | + | + | stratum information on the west, the south and the north can be detected |
| 15 | + | + | + | + | omnidirectional stratum information can be detected |

In Table 1, + indicates that the antenna 19 is in the excited state, − indicates that the antenna 19 is in a non-excited state.

During downhole detection, detection of stratum information at different axial depths can be realized through lifting the probe up and lowering the probe down; detection of stratum information at different radial depths can be realized through changing excitation frequency of the antenna 19; detection of stratum information at different azimuth angles can be realized through exciting different antennas 19. As a result, detection capacity of the probe in three dimensions can be realized through combining signals in the axial depth dimension, the radial depth dimension and at a circumferential azimuth angle. In this embodiment, the axial direction refers to a direction in which the central axis of a bore extends, the radial direction refers to a direction in which a bore center outwardly extends along its radius, and the circumferential direction refers to an extension direction surrounding the bore center.

Preferably, the probe also includes: a housing 4; the antennas 19 are arranged in the housing 4. As shown in FIG. 1, four housings 4 are arranged in the probe for four antennas 19 to be respectively arranged therein, and arrows in FIG. 1 show mounting direction of the housings 4. The housings 4 can separate the antennas 19 from the drilling fluid, thereby preventing the drilling fluid from interfering with the antennas 19.

Figure 2:
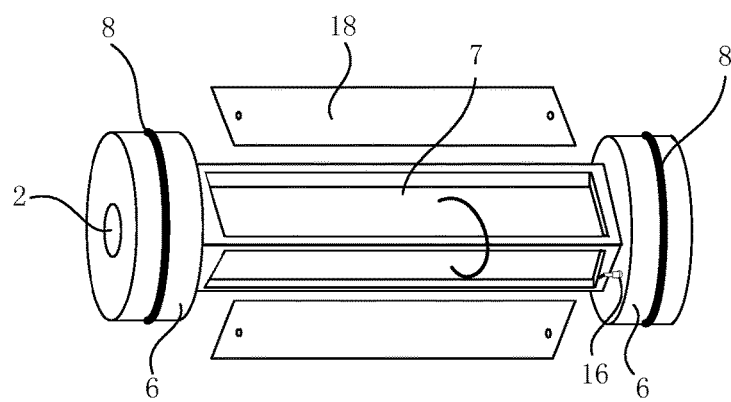
FIG. 2 is a structure diagram of an excitation transmitter of the nuclear magnetic resonance logging instrument provided by Embodiment 1 of the present invention.

The excitation transmitter may include a transmitter framework and an excitation circuit. FIG. 2 is a structure diagram of an excitation transmitter of the nuclear magnetic resonance logging instrument provided by Embodiment 1 of the present invention. As shown in FIG. 2, in this embodiment, the transmitter framework may include two end portions 6 and a middle part 5 arranged in between, the middle part 5 is of prismatic shape, and the end portions 6 are of cylindrical shape. The middle part 5 and the two end portions 6 may be of an integrated structure.

The middle part 5 is configured to bear the excitation circuit, the excitation circuit may be fixedly arranged on a side face of the middle part 5. Preferably, the excitation circuit may be divided into multiple circuit boards 7, the number of the circuit boards 7 may be less than or equal to that of lateral edges of the middle part 5, and the multiple circuit boards 7 are respectively fixed on different side faces of the middle part 5.

For instance, the excitation circuit consists of four circuit boards 7, the middle part 5 is a quadrangular prism with four lateral edges, and the four circuit boards 7 are respectively fixed on four side faces of the quadrangular prism. When the number of the circuit boards 7 changes, structure of the middle part 5 can be correspondingly adjusted.

Specifically, a shielding groove is formed on each side face of the middle part 5 and is shaped to match with the shape of the circuit board 7, the multiple circuit boards 7 are respectively arranged in the multiple shielding grooves to be fixed to the middle part 5 by screw joint. In addition, the excitation transmitter may also include: a cover 18, which, after the circuit boards 7 are fixed in the shielding grooves, may be covered over the shielding grooves, and fixedly connected with the transmitter framework, so as to efficiently prevent an external electromagnetic field from interfering with the circuit boards 7.

The end portions 6 and the bearing component 1 may be fixedly connected, specifically, the holding cavity may be of cylindrical shape, the end portions 6 may form interference fit with the bearing component 1, enabling the end portions 6 to be firmly fixed to the bearing component 1, and preventing relative motion between the end portions 6 and the bearing component 1 which otherwise is liable to happen.

Alternatively, the end portions 6 are provided with multiple bulges, multiple recesses are arranged in the bearing component 1 to match with the multiple bulges, and the multiple bulges are respectively fastened by the multiple recesses, thereby realizing fastening fixation between the end portions 6 and the bearing component 1, and the structure is simple and easy to implement.

Further, the length of the transmitter framework may be matched with that of the holding cavity of the bearing component 1, which is to say, the length of the transmitter framework may be equal to or slightly less than that of the holding cavity, such that both end portions of the transmitter framework can respectively butt against the bearing component 1, thereby preventing relative motion along the axis between the transmitter framework and the bearing component 1.

In addition, a sealing ring 8 may be arranged between the end portions 6 of the transmitter framework and the bearing component 1, the sealing ring 8 may be an O type sealing ring, through which the end portions 6 of the transmitter framework is in close contact with the bearing component 1, allowing the excitation circuit to be separated from the drilling fluid in the slurry channel 2, thereby ensuring normal operation of the excitation circuit.

Figure 3:
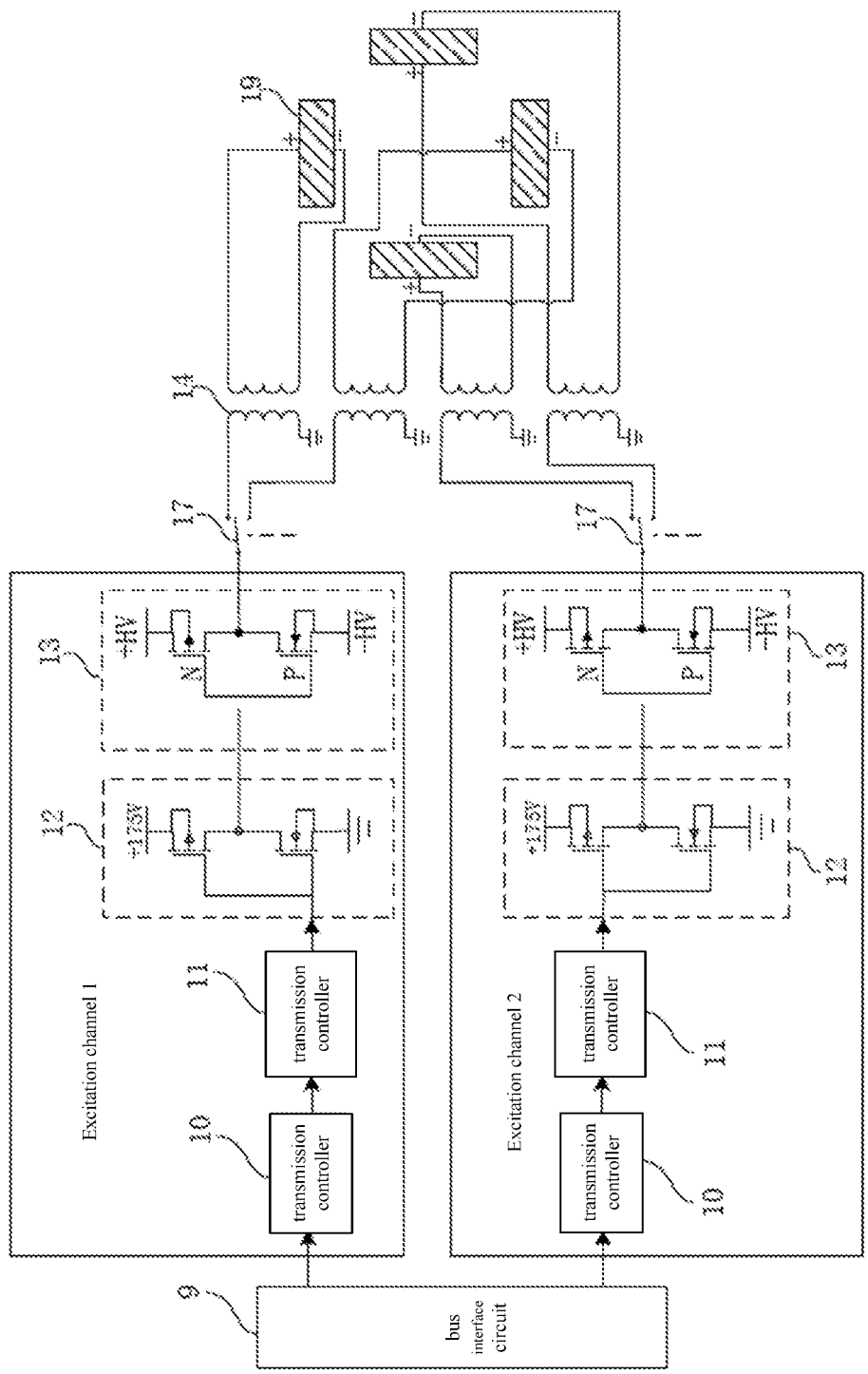
FIG. 3 is a structure diagram of an excitation circuit of the nuclear magnetic resonance logging instrument provided by Embodiment 1 of the present invention.

FIG. 3 is a structure diagram of an excitation circuit of the nuclear magnetic resonance logging instrument provided by Embodiment 1 of the present invention. As shown in FIG. 3, the excitation circuit in this embodiment may include: a bus interface circuit 9, a transmission controller 10, a level conversion circuit 11, a power tube driving circuit 12, a power amplifying circuit 13 and a coupling transformer 14.

Where, the bus interface circuit 9 is configured to receive a signal transmission command sent by a control center, and to convert the signal transmission command into an instruction that is processable to the transmission controller 10. The transmission controller 10 is electrically connected with the bus interface circuit 9, and is configured to receive the instruction sent by the bus interface circuit 9 and generate a pulse signal according to the instruction. Frequency of the pulse signal determines that of the excitation signal which is generated last, and the number of cycles of the pulse signal determines bandwidth of the excitation signal. In this embodiment, the transmission controller 10 may be a digital signal processor or any other microprocessors capable of generating pulse signals.

The level conversion circuit 11 is electrically connected with the transmission controller 10, and is configured to convert the pulse signal generated by the transmission controller 10 into a pulse signal suitable for processing by the power tube driving circuit 12. The power tube driving circuit 12 is electrically connected with the level conversion circuit 11, and is configured to generate a driving signal to drive the power amplifying circuit 13, according to the pulse signal outputted by the level conversion circuit 11. The power amplifying circuit 13 is electrically connected with the power tube driving circuit 12, and is configured for power amplification of the driving signal so as to generate a power amplified signal.

As shown in FIG. 3, the power amplifying circuit 13 may be formed of a pair of large-power N channel power tube and P channel power tube operated in switching status. The N channel power tube and P channel power tube of the power amplifying circuit 13 are alternately turned on and off under control of the driving signal, enabling current to flow from a positive high voltage +HV, via the N channel power tube to a primary winding of the coupling transformer 14 before finally flowing to a reference ground, or to flow from the reference ground, via the primary winding of the coupling transformer 14 to P channel power tube before flowing to negative high voltage −HV, thereby forming alternating positive-negative bipolar pulse signal, i.e., the power amplified signal.

The coupling transformer 14 is electrically connected with the power amplifying circuit 13, and is configured to generate an excitation signal according to the power amplified signal, and the excitation signal is used to excite the antennas 19 of the probe. Specifically, in this embodiment, there may be multiple of the transmission controllers 10, level conversion circuits 11, power tube driving circuits 12, power amplifying circuits 13 and coupling transformers 14 due to the multiple antennas 19.

As shown in FIG. 3, there are four antennas 19, the excitation circuit is provided with two excitation channels and four of the coupling transformers 14. The two excitation channels are used for time division multiplexing; each excitation channel includes the transmission controller 10, the level conversion circuit 11, the power tube driving circuit 12 and the power amplifying circuit 13; and each excitation channel may control two coupling transformers 14 via a relay 17 or other switching devices, therefore, two excitation channels may control four coupling transformers 14, and further realize excitation of the four antennas 19.

Regarding modules such as the bus interface circuit 9, the transmission controller 10, the level conversion circuit 11, the power tube driving circuit 12, the power amplifying circuit 13 and the coupling transformer 14, those skilled in the art can determine specific implementations of each module based on actual demand, for which there will be no more detail in this embodiment.

In the nuclear magnetic resonance logging instrument provided by the embodiment, multiple antennas 19 which individually and independently provide feed are distributed around the magnet 3, and through exciting different antennas 19, it is possible to realize detection of stratum information at different azimuth angles, thus improving circumferential resolution of a nuclear magnetic resonance logging instrument probe, and realizing formation detection in three dimensions in the direction of the radius, axis and circumference.

Based on the technical solutions provided by the previous embodiment, preferably, a through hole is correspondingly formed on the bearing component 1 and the housing 4, and a first sealing joint 15 passes through the through hole of the bearing component 1 and the housing 4; the excitation circuit and the antenna 19 are electrically connected via a wire, and the wire passes through the first sealing joint 15. The first sealing joint 15 is able to prevent the drilling fluid from entering the probe housing 4 or the holding cavity of the bearing component 1, thus ensuring normal operation of the antennas 19 and the excitation circuit.

In addition, a through hole is also correspondingly formed on the transmitter framework and the bearing component 1, a second sealing joint 16 passes through the through hole of the bearing component 1 and the transmitter framework, the wire between the excitation circuit and the control center may pass through the second sealing joint 16, as a result, communication between the excitation circuit and the control center is realized with the drilling fluid be separated.

Embodiment 2

Embodiment 2 of the present invention provides a nuclear magnetic resonance logging instrument. Specifically, the nuclear magnetic resonance logging instrument in this embodiment may a wire-line nuclear magnetic resonance logging instrument, and correspondingly, the bearing component 1 may be a short instrument section. This embodiment differs from Embodiment 1 in that, the slurry channel 2 is not required to be formed on the bearing component 1 and the transmitter framework for the drilling fluid to flow through, except this, the structure and function of each part in this embodiment are similar to those in Embodiment 1 and will not be repeated herein.

In the wire-line nuclear magnetic resonance logging instrument provided by this embodiment, multiple antennas 19 which individually and independently provide feed are distributed around the magnet 3, and through exciting different antennas 19, it is possible to realize detection of stratum information at different azimuth angles, thus improving circumferential resolution of a nuclear magnetic resonance logging instrument probe, and realizing formation detection in three dimensions in the direction of the radius, axis and circumference.

Finally, it should be noted that, the various embodiments above are intended to describe, rather than limit the technical solutions of the present invention; and although the present invention is detailed referring to the aforementioned embodiments, one of ordinary skill in the art should understand that modifications can be made to the technical solutions recorded by the various embodiments above, or that equivalent substitutions can be made to some or all of the technical features; and these modifications or substitutions shall not make essence of the technical solutions depart from the scope of technical solutions in the embodiments of the present invention.

What is claimed is:

1. A nuclear magnetic resonance logging instrument, comprising: a probe, an excitation transmitter and a bearing component; wherein,
the probe comprises: a magnet and multiple antennas arranged at outer side of the magnet, and the multiple antennas individually and independently provide feed;
a holding cavity is provided in the bearing component, and the excitation transmitter is fixed in the holding cavity; and
the excitation transmitter comprises a transmitter framework and an excitation circuit; the transmitter framework and the bearing component are fixedly connected; and the excitation circuit is fixed on the transmitter framework, and is electrically connected with each of the multiple antennas for feeding the multiple antennas;
wherein the transmitter framework comprises two end portions and a middle part arranged between the two end portions, the middle part is of prismatic shape, and the end portions are of cylindrical shape;
the middle part and the two end portions are of an integrated structure;
the excitation circuit is fixedly arranged on a side face of the middle part;
the antennas are used to realize detection of stratum information at different azimuth angles, thus realizing formation detection in three dimensions in the direction of the borehole radius, axis and circumference.

2. The nuclear magnetic resonance logging instrument according to claim 1, wherein,
the excitation circuit is divided into multiple circuit boards, the number of the circuit boards is less than or equal to the number of lateral edges of the middle part; and
the multiple circuit boards are fixed on different side faces of the middle part.

3. The nuclear magnetic resonance logging instrument according to claim 2, wherein a shielding groove is formed on each side face of the middle part and is shaped to match with a shape of the circuit board;
the multiple circuit boards are respectively arranged in multiple shielding grooves and fixed to the middle part through a screw.

4. The nuclear magnetic resonance logging instrument according to claim 1, wherein a length of the transmitter framework is matched with a length of the holding cavity of the bearing component, and a sealing ring is provided between the ends of the transmitter framework and the bearing component.

5. The nuclear magnetic resonance logging instrument according to claim 1, wherein the holding cavity is of cylindrical shape, and the ends and the bearing component form interference fit; or
the ends are provided with multiple bulges, multiple recesses are provided in the bearing component to match with the multiple bulges, and the multiple bulges are respectively fastened by the multiple recesses.

6. The nuclear magnetic resonance logging instrument according to claim 1, wherein the excitation circuit comprises: a bus interface circuit, a transmission controller, a level conversion circuit, a power tube driving circuit, a power amplifying circuit and a coupling transformer;
the bus interface circuit is configured to receive a signal transmission command sent by a control center, and to convert the signal transmission command into an instruction that is processable to the transmission controller;
the transmission controller is electrically connected with the bus interface circuit, and is configured to receive the instruction sent by the bus interface circuit and generate a pulse signal according to the instruction;
the level conversion circuit is electrically connected with the transmission controller, and is configured to convert the pulse signal generated by the transmission controller into a pulse signal suitable for processing by the power tube driving circuit;
the power tube driving circuit is electrically connected with the level conversion circuit, and is configured to generate a driving signal to drive the power amplifying circuit, according to the pulse signal outputted by the level conversion circuit;
the power amplifying circuit is electrically connected with the power tube driving circuit, and is configured for power amplification of the driving signal so as to generate a power amplified signal; and
the coupling transformer is electrically connected with the power amplifying circuit, and is configured to generate an excitation signal according to the power amplified signal, and the excitation signal is configured to excite the antennas of the probe.

7. The nuclear magnetic resonance logging instrument according to claim 1, wherein the probe also comprises: a housing; and the antennas are arranged in the housing;
a through hole is correspondingly formed on the bearing component and the housing for a sealing joint to pass through; and
the excitation circuit and the antenna are electrically connected via a wire, and the wire passes through the sealing joint.

8. The nuclear magnetic resonance logging instrument according to claim 1, wherein the nuclear magnetic resonance logging instrument is a while drilling nuclear magnetic resonance logging instrument; and
correspondingly, the bearing component is a drill collar; and a slurry channel is formed in both the drill collar and the transmitter framework for drilling fluid to flow through.

9. The nuclear magnetic resonance logging instrument according to claim 1, wherein the nuclear magnetic resonance logging instrument is a wire-line nuclear magnetic resonance logging instrument; and
correspondingly, the bearing component is a short instrument section.

10. A nuclear magnetic resonance logging instrument according to claim 1, comprising: a probe, an excitation transmitter and a bearing component; wherein,
the probe comprises: a magnet for forming a static magnetic field for polarizing a self-spinning hydrogen proton and multiple antennas for transmitting a radio frequency field for turning the self-spinning hydrogen proton around arranged at outer side of the magnet, and the multiple antennas individually and independently provide feed;
a holding cavity is provided in the bearing component, and the excitation transmitter is fixed in the holding cavity; and the excitation transmitter comprises a transmitter framework and an excitation circuit; the transmitter framework and the bearing component are fixedly connected; and the excitation circuit is fixed on the transmitter framework, and is electrically connected with each of the multiple antennas for feeding the multiple antennas;

wherein the transmitter framework comprises two end portions and a middle part arranged between the two end portions, the middle part is of prismatic shape, and the end portions are of cylindrical shape;

the middle part and the two end portions are of an integrated structure;

the excitation circuit is fixedly arranged on a side face of the middle part;

the antennas are used to realize detection of stratum information at different azimuth angles, thus realizing formation detection in three dimensions in the direction of the borehole radius, axis and circumference.

* * * * *